(12) United States Patent
Kwon et al.

(10) Patent No.: US 11,115,756 B2
(45) Date of Patent: Sep. 7, 2021

(54) MEMS MICROPHONE AND METHOD OF MANUFACTURING THE SAME

(71) Applicant: DB HITEK CO., LTD., Seoul (KR)

(72) Inventors: Hyeok In Kwon, Gyeonggi-do (KR); Jong Won Sun, Gyeonggi-do (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/850,103

(22) Filed: Apr. 16, 2020

(65) Prior Publication Data

US 2020/0336842 A1   Oct. 22, 2020

(30) Foreign Application Priority Data

Apr. 16, 2019  (KR) .................. 10-2019-0044268

(51) Int. Cl.
*H04R 19/00* (2006.01)
*H04R 19/04* (2006.01)
*B81B 7/00* (2006.01)
*B81C 1/00* (2006.01)
*H04R 31/00* (2006.01)

(52) U.S. Cl.
CPC ........... *H04R 19/04* (2013.01); *B81B 7/0061* (2013.01); *B81C 1/00309* (2013.01); *H04R 31/003* (2013.01); *B81B 2201/0257* (2013.01); *B81B 2203/0127* (2013.01); *B81B 2203/0315* (2013.01); *B81B 2203/04* (2013.01); *B81C 2201/013* (2013.01); *H04R 2201/003* (2013.01)

(58) Field of Classification Search
CPC ................. H04R 19/04; H04R 31/003; H04R 2201/003; H04R 31/006; H04R 19/005; B81B 7/0061; B81B 2201/0257; B81B 2203/04; B81B 2203/0315; B81B 2203/0127; B81B 2207/07; B81B 7/0029; B81C 1/00309; B81C 2201/013; B81C 1/00095

See application file for complete search history.

(56) References Cited

U.S. PATENT DOCUMENTS

2015/0230029 A1*  8/2015  Hong ................... G10K 11/002
                                                                    381/396
2018/0086624 A1*  3/2018  Cheng .................... B81B 3/007

* cited by examiner

*Primary Examiner* — Matthew A Eason
(74) *Attorney, Agent, or Firm* — Patterson Thuente Pedersen, P.A.

(57) ABSTRACT

A MEMS microphone includes a first dummy pad elevating a circumferential portion of an intermediate insulation layer adjacent to a second pad electrode, a second dummy pad elevating a first circumferential portion of an upper insulation layer adjacent to the second pad electrode, and a third dummy pad elevating a second circumferential portion of the upper insulation layer adjacent to the first pad electrode. Thus the first circumferential portion of the upper insulation layer is elevated relative to an upper surface of the second pad electrode, and the second circumferential portion of the upper insulation layer is elevated relative to an upper surface of the first pad electrode.

14 Claims, 7 Drawing Sheets

MEMS MICROPHONE AND METHOD OF MANUFACTURING THE SAME

CROSS-REFERENCE TO RELATED APPLICATION

This application claims priority to Korean Patent Application No. 10-2019-0044268, filed on Apr. 16, 2019 and all the benefits accruing therefrom under 35 U.S.C. § 119, the contents of which are incorporated by reference in their entirety.

TECHNICAL FIELD

The present disclosure relates to microelectromechanical systems (MEMS) microphones capable of converting an acoustic wave into an electrical signal, and a method of manufacturing such MEMS microphones, and more particularly, to capacitive MEMS microphones being capable of transmitting signal related to an acoustic signal using a displacement which may be generated due to an acoustic pressure and a method of manufacturing such MEMS microphones.

BACKGROUND

Generally, a capacitive microphone utilizes a capacitance between a pair of electrodes which are facing each other to generate an electrical signal corresponding to an incoming acoustic signal. A MEMS microphone may be manufactured by a semiconductor MEMS process.

The MEMS microphone may include a substrate including a cavity, a bendable diaphragm and a back plate which is facing the diaphragm. In addition, the MEMS microphone may further include a first pad electrode being in electrical contact with the diaphragm and a second pad electrode being in electrical contact with the back plate.

After forming the diaphragm, the back plate, the first pad electrode, and the second pad electrode on an upper surface of the substrate in manufacturing process of the MEMS microphone, the cavity is formed on a lower surface of the substrate.

In order to form the diaphragm, the back plate, the first pad electrode, and the second pad electrode, various films are formed on the upper surface of the substrate. The substrate is curved to be convex upward due to stress caused by the various films.

In order to form the cavity, a photo process and an etching process are performed on the lower surface of the substrate while the upper surface of the substrate is fixed to a chuck.

Since the chuck fixes the upper surface of the curved substrate, pressing force of the chuck acts relatively more on a central portion of the substrate than peripheral portions thereof. Further, the first pad electrode and the second pad electrode contact the chuck. Therefore, damage such as a scratch may occur to the first pad electrode and the second pad electrode by the pressing force of the chuck. When the first pad electrode and the second pad electrode are damaged, the first pad electrode and the second pad electrode may be recognized as defects in an inspection process for the MEMS microphone.

SUMMARY

The example embodiments of the present invention provide a MEMS microphone capable of preventing a first pad electrode and a second pad electrode from being damaged, and a method of manufacturing the MEMS microphone.

According to an example embodiment of the present invention, a MEMS microphone includes a substrate presenting a vibration area, a supporting area surrounding the vibration area, and a peripheral area surrounding the supporting area, the substrate defining a cavity formed in the vibration area; a diaphragm being disposed over the substrate to cover the cavity, the diaphragm being spaced apart from the substrate and configured to generate a displacement thereof in response to an applied acoustic pressure; an upper back plate being disposed over the diaphragm in the vibration area, the upper back plate being spaced apart from the diaphragm to form an air gap between the diaphragm and the upper back plate, and the upper back plate defining a plurality of acoustic holes therein; a diaphragm pad disposed in the peripheral area and in electrical contact with the diaphragm; a back plate pad disposed in the peripheral area and in electrical contact with the back plate; an upper insulation layer covering the back plate and mechanically coupled to the back plate to space the back plate apart from the diaphragm; a lower insulation layer disposed on an upper surface of the substrate and supporting the diaphragm pad; an intermediate insulation layer disposed between the lower insulation layer and the upper insulation layer and supporting the back plate pad; a first pad electrode penetrating through the upper insulation layer and the intermediate insulation layer and disposed on the diaphragm pad; a second pad electrode penetrating through the upper insulation layer and disposed on the back plate pad; a first dummy pad interposed between the lower insulation layer and the intermediate insulation layer, wherein the first dummy pad is arranged to elevate a circumferential portion of the intermediate insulation layer adjacent to the second pad electrode relative to a another portion of the intermediate insulation layer such that a first circumferential portion of the upper insulation layer corresponding to the circumferential portion of the intermediate insulation layer, is elevated relative to an upper surface of the second pad electrode; a second dummy pad interposed between the intermediate insulation layer and the upper insulation layer to surround the back plate pad, wherein the second dummy pad is arranged to elevate the first circumferential portion of the upper insulation layer corresponding to the first dummy pad relative to another portion of the upper insulation layer such that the first circumferential portion of the upper insulation layer is elevated relative to the upper surface of the second pad electrode; and a third dummy pad interposed between the intermediate insulation layer and the upper insulation layer, wherein the third dummy pad is arranged to elevate a second circumferential portion of the upper insulation layer adjacent to the first pad electrode is elevated relative to another portion of the upper insulation layer such that the second circumferential portion of the upper insulation layer is elevated relative to an upper surface of the first pad electrode.

In an example embodiment, the second dummy pad may be disposed above the first dummy pad.

In an example embodiment, the third dummy pad may be disposed above the diaphragm pad.

In an example embodiment, the intermediate insulation layer includes a portion located inside of the third dummy pad, thinner than that of other portion of the intermediate insulation layer so that the upper surface of the upper insulation layer adjacent to the first pad electrode protrudes from the upper surface of the first pad electrode.

In an example embodiment, the diaphragm, the diaphragm pad and the first dummy pad all have a first thickness, and the back plate, the back plate pad, the second dummy pad and the third dummy pad all have a second thickness, and wherein the first thickness can be either the same as or different from the second thickness.

In an example embodiment, the lower insulation layer and the intermediate insulation layer may be disposed in the peripheral area.

According to an example embodiment of the present invention, a method of manufacturing a MEMS microphone comprises forming a lower insulation layer on a substrate being divided into a vibration area, a supporting area surrounding the vibration area, and a peripheral area surrounding the supporting area; forming a diaphragm on the lower insulation layer in the vibration area, a diaphragm pad in electrical contact with the diaphragm on the lower insulation layer in the peripheral area, and a first dummy pad on the lower insulation layer in the peripheral area; forming an intermediate insulation layer on the lower insulation layer to cover the diaphragm, the diaphragm pad, and the first dummy pad; forming a back plate facing the diaphragm on the intermediate insulation layer in the vibration area, a back plate pad in electrical contact with the back plate on the intermediate insulation layer in the peripheral area, a second dummy pad on the intermediate insulation layer in the peripheral area, and a third dummy pad on the intermediate insulation layer in the peripheral area; forming an upper insulation layer holding the back plate to be spaced from the diaphragm on the intermediate insulation layer to cover the back plate, the back plate pad, the second dummy pad, and the third dummy pad; forming a first pad electrode penetrating through the upper insulation layer on the diaphragm pad and the intermediate insulation layer; and forming a second pad electrode penetrating through the upper insulation layer on the back plate pad, wherein the first dummy pad is arranged to elevate a circumferential portion of the intermediate insulation layer adjacent to the second pad electrode relative to a another portion of the intermediate insulation layer such that a first circumferential portion of the upper insulation layer corresponding to the circumferential portion of the intermediate insulation layer, is elevated relative to an upper surface of the second pad electrode, wherein the second dummy pad is arranged to elevate the first circumferential portion of the upper insulation layer corresponding to the first dummy pad relative to another portion of the upper insulation layer such that the first circumferential portion of the upper insulation layer is elevated relative to the upper surface of the second pad electrode, and wherein the third dummy pad is arranged to elevate a second circumferential portion of the upper insulation layer adjacent to the first pad electrode relative to another portion of the upper insulation layer such that the second circumferential portion of the upper insulation layer is elevated relative to an upper surface of the first pad electrode.

In an example embodiment, the second dummy pad may be disposed above the first dummy pad.

In an example embodiment, the third dummy pad may be disposed above the diaphragm pad.

In an example embodiment, the method of manufacturing a MEMS microphone may further comprise prior to forming the back plate, the back plate pad, the second dummy pad and the third dummy pad, respectively, forming a stepped hole by partially etching the intermediate insulation layer in the portion where the first pad electrode is to be formed.

In an example embodiment, the forming of the first pad electrode and the second pad electrode includes forming a first contact hole exposing the diaphragm pad by patterning the upper insulation layer and the intermediate insulation layer in the peripheral area; forming a second contact hole exposing the back plate pad by patterning the upper insulation layer in the peripheral area; and forming the first pad electrode on the diaphragm pad inside of the first contact hole and the second pad electrode on the back plate pad inside of the second contact hole, respectively.

In an example embodiment, the method of manufacturing a MEMS microphone may further comprise after forming the first pad electrode and the second pad electrode, patterning the back plate to form a plurality of acoustic holes which penetrate through the back plate and the upper insulation layer; patterning the substrate to form a cavity in the vibration area; and performing an etching process using the cavity and the acoustic holes to remove portions of the sacrificial layer and the lower insulation layer, located at positions corresponding to the vibration area and the supporting area so that a displacement of the diaphragm is generated by an applied acoustic pressure.

In an example embodiment, forming the diaphragm, the diaphragm pad, and the first dummy pad may include forming a plurality of vent holes penetrating through the diaphragm simultaneously with the diaphragm, the diaphragm pad, and the first dummy pad, and the vent holes are formed in the vibration area.

In an example embodiment, the vent holes may serve as passages for the etchant to remove the portions of the lower insulation layer and the intermediate insulation layer during the etching process.

According to example embodiments of the present invention as described above, the height of the upper surfaces of the first pad electrode and the second pad electrode are lower than the height of the upper surface of the upper insulation layer. Even if a chuck fixes a curved substrate, the first pad electrode and the second pad electrode do not contact the chuck. Therefore, it is possible to prevent the first pad electrode and the second pad electrode from being damaged by the chuck.

Since damage of the first pad electrode and the second pad electrode can be prevented, the first pad electrode and the second pad electrode are not recognized as defects in an inspection process for the MEMS microphone. Therefore, yield of the MEMS microphone manufacturing process can be improved.

The above summary is not intended to describe each illustrated embodiment or every implementation of the subject matter hereof. The figures and detailed description that follow more particularly exemplify various embodiments.

BRIEF DESCRIPTION OF THE DRAWINGS

Example embodiments can be understood in more detail from the following description taken in conjunction with the accompanying drawings, in which.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. By contrast, it will also be understood that when a layer, a film, a region or a plate is referred to as being 'directly on' another one, it is directly on the other one, and one or more intervening layers, films, regions or plates do not exist. Also, although terms such as a first, a second, and a third are used to describe various components, compositions, regions, films, and layers in various embodiments of the present invention, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. The Figures are not necessarily drawn to scale. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
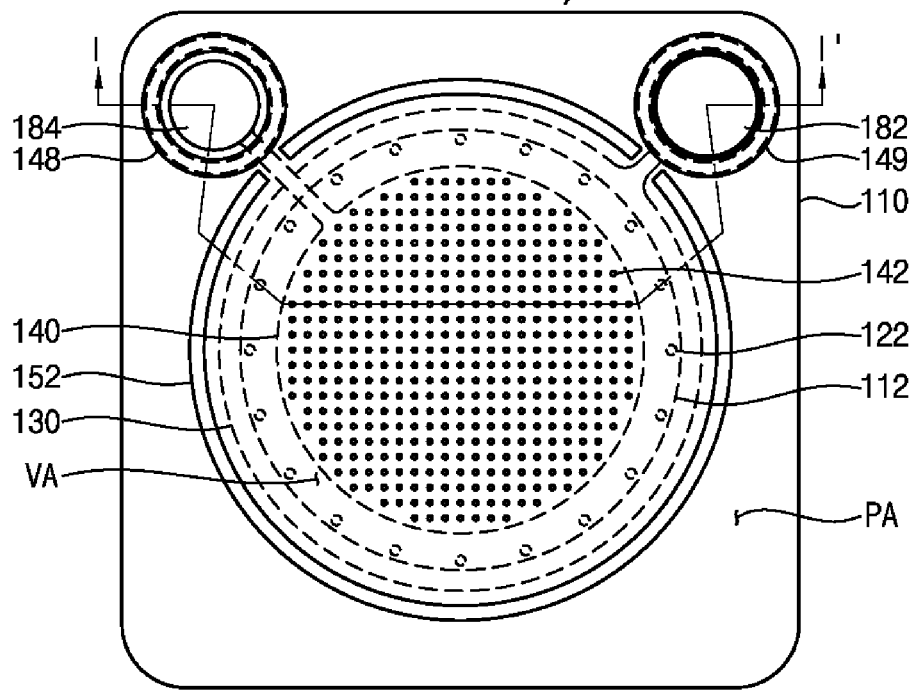
FIG. 1 is a plan view illustrating a MEMS microphone in accordance with an example embodiment of the present invention.
Figure 2:
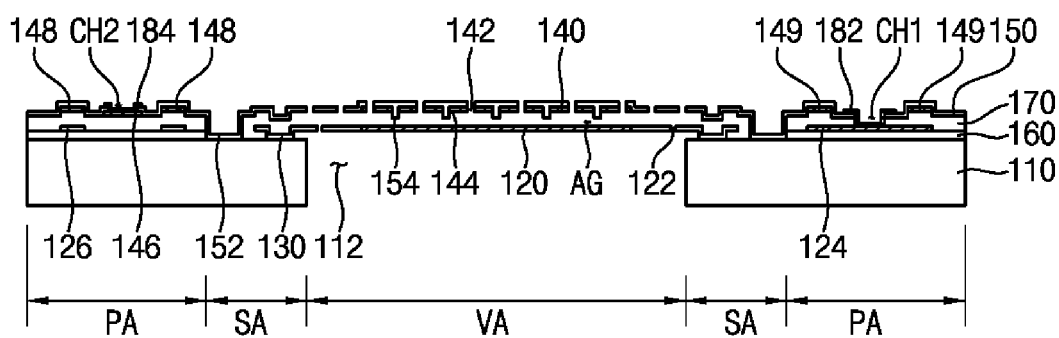
FIG. 2 is a cross sectional view taken along a line I-I' of FIG. 1.
Figure 3:
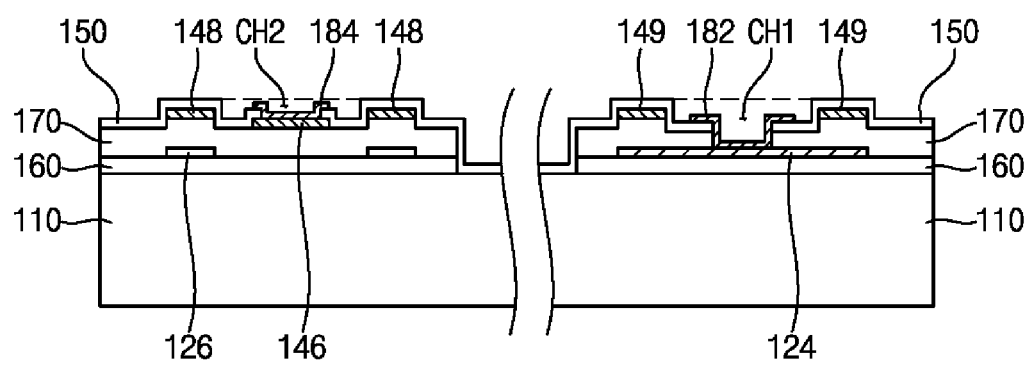
FIG. 3 is an enlarged view illustrating a peripheral area shown in FIG. 2.

FIG. 1 is a plan view illustrating a MEMS microphone in accordance with an example embodiment of the present invention, FIG. 2 is a cross sectional view taken along a line I-I' of FIG. 1, and FIG. 3 is an enlarged view illustrating a peripheral area shown in FIG. 2.

Referring to FIGS. 1 to 3, a MEMS microphone 100 in accordance with an example embodiment of the present invention is capable of creating a displacement with responding to an acoustic pressure to convert an acoustic wave into an electrical signal and output the electrical signal. The MEMS microphone 100 includes a substrate 110, a diaphragm 120, an anchor 130, and a back plate 140.

The substrate 110 is divided into a vibration area VA, a supporting area SA surrounding the vibration area VA, and a peripheral area PA surrounding the peripheral area SA. A cavity 112 is formed in the substrate 110 to define the vibration area VA.

In an example embodiment, the cavity 112 may have a cylindrical shape, and may be formed in the vibration area VA to have a shape and a size corresponding to those of the vibration area VA.

The diaphragm 120 may be disposed over the substrate 110. The diaphragm may have a membrane structure. The diaphragm 120 may be displaced by an incident acoustic pressure. The diaphragm 120 may cover the cavity 112. The diaphragm 120 may have a lower surface that is exposed at the cavity 112. The diaphragm 120 is spaced apart from the substrate 110 so that the diaphragm 120 is bendable in response to the incident acoustic pressure.

The diaphragm 120 may have a doped portion being doped with impurities through an ion implantation process. The portion doped with impurities in the diaphragm 120 corresponds to the back plate 140. In an example embodiment, the diaphragm 120 may have a shape of a circular disc.

The anchor 130 may be disposed at an end portion of the diaphragm 120. The anchor 130 may extend along a circumference of the diaphragm 120. Therefore, the anchor 130 may have a ring shape, and may be disposed to surround the cavity 112.

The anchor 130 may be disposed in the supporting area SA of the substrate 110. The anchor 130 may support the diaphragm 120. The anchors 130 may extend from an outer periphery of the diaphragm 120 toward the substrate 110 to space the diaphragm 120 from the substrate 110.

In an example of embodiment, the anchor 130 may be integrally formed with the diaphragm 120. Here, a lower surface of the anchor 130 may be in contact with an upper surface of the substrate 110 and may be fixed to the upper surface of the substrate 110.

Alternatively, in an embodiment not shown in detail in figures, the anchor 130 may be provided as a plurality of separate components along the circumference of the diaphragm 120. Specifically, each of the anchors 130 may have a cylindrical shape. The anchors 130 may be spaced apart from each other. The anchor 130 may have a 'U'-shaped vertical section. In particular, an empty space is formed between two anchors 130 adjacent to each other so that the space may act as a passage through which the acoustic wave passes.

The diaphragm 120 may have a plurality of vent holes 122. Each of the vent holes 122 may be arranged along the anchor 130 in a ring shape and may be spaced apart from each another. The vent holes 122 are formed by penetrating through the diaphragm 130 in a vertical direction, and communicate with the cavity 112. Specifically, each of the vent holes 122 may serve as a passage for the acoustic wave. Further, each of the vent holes 122 may also function as a passage for an etchant to be used in a process of manufacturing the MEMS microphone 100.

The vent holes 122 may be positioned in the vibration area VA. Alternatively, the vent holes 122 may be positioned in a boundary area between the vibration area VA and the supporting area SA or in the supporting area SA adjacent to the vibration area VA.

The back plate 140 may be disposed over the diaphragm 120. The back plate 140 may be disposed in the vibration area VA to face the diaphragm 120. The back plate 140 may have a doped portion being doped with impurities through an ion implantation process. In an example embodiment, the back plate 140 may have a shape of a circular disc.

The MEMS microphone 100 may further include an upper insulation layer 150 supporting the back plate 140, and a strut 152.

In particular, the upper insulation layer 150 is positioned over the substrate 110 on which the back plate 140 is positioned. The upper insulation layer 150 may cover the back plate 140. Further, the upper insulation layer 150 may hold the back plate 140. Thus, the upper insulation layer 150 may space the back plate 140 from the diaphragm 120. In addition, the back plate 140 and the upper insulation layer 150 are spaced apart from the diaphragm 120 to make the diaphragm 120 freely bendable with responding to an applied acoustic pressure. Thus, an air gap AG is formed between the diaphragm 120 and the back plate 140.

A plurality of acoustic holes 142 may be formed through the back plate 140 such that the acoustic wave may flow through the acoustic holes 142. The acoustic holes 142 may be formed through the upper insulation layer 150 and the back plate 140 to communicate with the air gap AG.

The back plate 140 may include a plurality of dimple holes 144. Further, the upper insulation layer 150 may include a plurality of dimples 154 corresponding to the dimple holes 144. The dimple holes 144 may be formed through the back plate 140. The dimples 154 may correspond to positions at which the dimple holes 144 are formed.

The dimples 154 may protrude from a lower surface of the back plate 140 toward the diaphragm 120. Therefore, the dimples 154 may prevent the diaphragm 120 from being irreversibly coupled to the lower surface of the back plate 140.

Particularly, when the acoustic pressure is applied to the diaphragm 120, the diaphragm 120 can be bent in a generally semispherical or paraboloid shape toward the back plate 140, and then can return to its initial position. The degree of bending of the diaphragm 120 may vary depending on a magnitude of the applied acoustic pressure. Even if the diaphragm 120 is bent so much as to contact the back plate 140, the dimples 154 may keep the diaphragm 120 and the back plate 140 sufficiently separated from each other that the diaphragm 120 is able to return to the initial position.

The strut 152 may be disposed in the supporting area SA and may be adjacent to the peripheral area PA. The strut 152 may support the upper insulation layer 150 to space the upper insulation layer 150 and the back plate 140 from the diaphragm 120. The strut 152 is formed by bending the upper insulation layer 150 toward the substrate 110. As shown in FIG. 2, the strut 152 may include a lower surface to make contact with the upper surface of the substrate 110.

The strut 152 may be spaced apart from the diaphragm 120 and may be disposed outside of the anchor 130 in a horizontal direction. The strut 152 may have a ring shape to surround the diaphragm 120.

In an example embodiment, the strut 152 may be integrally formed with the upper insulation layer 150. The strut 152 may have a U-shaped vertical section.

Meanwhile, the MEMS microphone 100 may further include a lower insulation layer 160, a diaphragm pad 124, a first dummy pad 126, an intermediate insulation layer 170, a back plate pad 146, a second dummy pad 148, and a third dummy pad 149, the first pad electrode 182, and the second pad electrode 184.

In particular, the lower insulation layer 160 may be disposed on the upper surface of the substrate 110 and under the upper insulation layer 150. The lower insulation layer 160 may be located in the peripheral area PA, and may be disposed outside of the strut 152 in a horizontal direction The diaphragm pad 124 may be formed on an upper surface of the lower insulation layer 160. The diaphragm pad 124 may be located in the peripheral area PA. The diaphragm pad 124 may be electrically connected to the diaphragm 120 and may be doped with impurities. Though not shown in detail in figures, impurities may also be doped to a portion of the diaphragm pad 124 that is connected to the doped portion of the diaphragm 120.

The first dummy pad 126 may be disposed on the upper surface of the lower insulation layer 160 and may be located in the peripheral area PA. The first dummy pad 126 may has a ring shape and may be disposed to surround a portion where the second pad electrode 184 is to be formed. The first dummy pad 126 may be arranged to elevate a circumferential portion of the intermediate insulation layer 170 adjacent to the second pad electrode 184 relative to a another portion of the intermediate insulation layer 170 such that a first circumferential portion of the upper insulation layer 150 corresponding to the circumferential portion of the intermediate insulation layer 170, is elevated relative to an upper surface of the second pad electrode 184.

In an example embodiment, the first dummy pad 126 is preferably not doped with the impurities. Alternatively, the first dummy pad 126 may be doped with the impurities.

In an example embodiment, the diaphragm 120, the diaphragm pad 124 and the first dummy pad 126 all have a first thickness.

The intermediate insulation layer 170 may be formed on the lower insulation layer 160 on which the diaphragm pad 124 and the first dummy pad 126 are formed. The intermediate insulation layer 170 is disposed between the lower insulation layer 160 and the upper insulation layer 150. The intermediate insulation layer 170 is located in the peripheral area PA, and is disposed outside of the strut 152 in a horizontal direction.

In addition, the lower insulation layer 160 and the intermediate insulation layer 170 may be made of different materials from those of the upper insulation layer 150. In an example embodiment, the upper insulation layer 150 may be made of a nitride such as a silicon nitride material, and the lower insulation layer 160 and the intermediate insulation layer 170 may be made of the oxide.

The back plate pad 146 may be disposed on an upper surface of the intermediate insulation layer 170 in the peripheral area PA. The back plate pad 146 may be electrically connected to the back plate 140 and may be doped with impurities by in ion implantation process. Though not shown in detail in figures, a connection portion connecting the back plate 140 and the back plate pad 146 may also be doped with impurities.

The second dummy pad 148 may be disposed on the upper surface of the intermediate insulation layer 170 and in the peripheral area PA. Specifically, the second dummy pad 148 may be disposed vertically above the first dummy pad 126. Therefore, the second dummy pad 148 may overlap the first dummy pad 126.

The second dummy pad 148 may have a ring shape and may be disposed to surround the back plate pad 146. The second dummy pad 148 may be arranged to elevate the first circumferential portion of the upper insulation layer 150 corresponding to the first dummy pad 126 relative to another portion of the upper insulation layer 150 such that the first circumferential portion of the upper insulation layer 150 is elevated relative to the upper surface of the second pad electrode 184.

The third dummy pad 149 may be disposed on the upper surface of the intermediate insulation layer 170 and in the peripheral area PA. Specifically, the third dummy pad 149 may be disposed vertically above the diaphragm pad 124. Therefore, the third dummy pad 149 may overlap the diaphragm pad 124.

The third dummy pad 149 may have a ring shape and may be disposed to surround a portion where the first pad electrode 182 is to be formed. The third dummy pad 149 may be arranged to elevate a second circumferential portion of the upper insulation layer 150 adjacent to the first pad electrode 182 relative to another portion of the upper insulation layer 150 such that the second circumferential portion of the upper insulation layer 150 is elevated relative to an upper surface of the first pad electrode 182.

The second dummy pad 148 and the third dummy pad 149 are preferably doped with the impurities, but the second dummy pad 148 and the third dummy pad 149 are not doped with the impurities.

In an example embodiment, the back plate 140, the back plate pad 146, the second dummy pad 148 and the third dummy pad 149 all have a second thickness. The first thickness may be either the same as or different from the second thickness.

The intermediate insulation layer 170 may include a portion positioned inside of the third dummy pad 149, that is, the portion where the first pad electrode 182 is to be formed, and thinner than other portion in the intermediate insulation layer 170. Accordingly, a difference in height between the third dummy pad 149 and the portion of the intermediate insulation layer 170 positioned inside of the third dummy pad 149 may be further increased.

As shown in FIGS. 2 and 3, a first contact hole CH1 is disposed in the peripheral area PA, and penetrates the upper insulation layer 150 and the intermediate insulation layer 170 to expose the diaphragm pad 124.

In addition, a second contact hole CH2 is disposed in the peripheral area PA, and penetrates the upper insulation layer 150 to expose the back plate pad 146.

The first pad electrode 182 may be disposed on the diaphragm pad 148 in the peripheral area PA. Therefore, the first pad electrode 182 may be in electrical contact with the diaphragm pad 124.

The first pad electrode 182 may be located at a center of the diaphragm pad 124. The third dummy pad 149 may be positioned vertically above the diaphragm pad 124. Therefore, the first pad electrode 182 may be located inside of the third dummy pad 149.

The second pad electrode 184 is positioned above the back plate pad 146 in the peripheral area PA, and may be in electrical contact with the back plate pad 146.

Since the second pad electrode 184 is positioned on the back plate pad 146 and the second dummy pad 148 is disposed to surround the back plate pad 146, the second pad electrode 184 may be located inside of the second dummy pad 148.

As described above, the second circumferential portion of the upper insulation layer 150 adjacent to the first pad electrode 182 is elevated by the diaphragm pad 124 and the third dummy pad 149, and the first circumferential portion of the upper insulation layer 150 adjacent to the second pad electrode 184 is elevated by the first dummy pad 126 and the second dummy pad 148. Therefore, the first pad electrode 182 has the upper surface lower than that of the second circumferential portion of the upper insulation layer 150, and the second pad electrode 184 has the upper surface lower than that of the first circumferential portion of the upper insulation layer 150. In the manufacturing process of the MEMS microphone 100, even if a chuck fixes the curved substrate 110, the first pad electrode 182 and the second pad electrode 184 do not contact the chuck. Therefore, it is possible to prevent the first pad electrode 182 and the second pad electrode 184 from being damaged by the chuck.

In addition, the strut 152 has a ring shape and is disposed to surround the diaphragm 120. Therefore, the strut 152 may block movement of the etchant for removing the intermediate insulation layer 170 and the lower insulation layer 160 into the peripheral area PA.

Further, the diaphragm 120 may have the vent holes 122 serving as passages for an acoustic wave and the etchant so that the acoustic wave can move smoothly and an efficiency of the etching process can be improved.

Hereinafter, a method of manufacturing a MEMS microphone will be described in detail with reference to the drawings.

Figure 4:
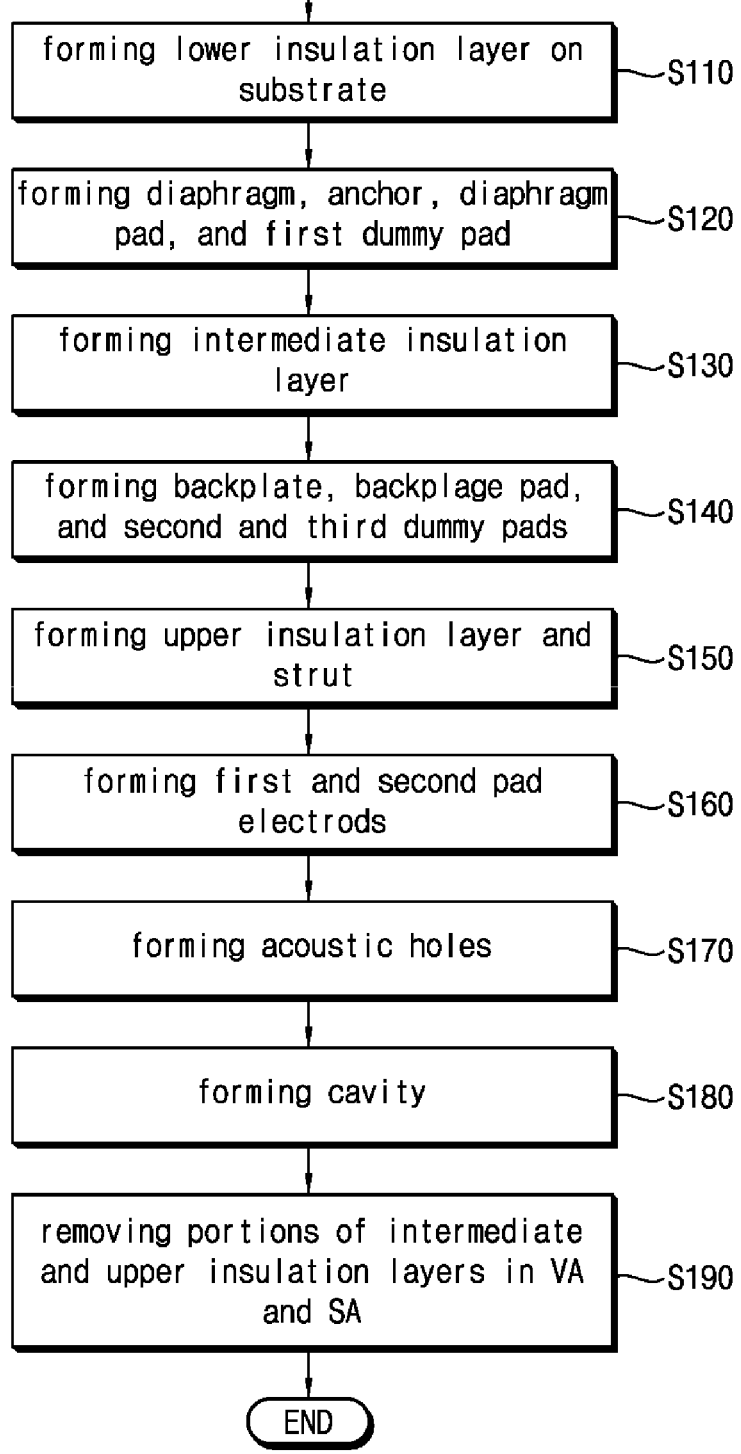
FIG. 4 is a flow chart illustrating a method of manufacturing a MEMS microphone in accordance with an example embodiment of the present invention.

FIG. 4 is a flow chart illustrating a method of manufacturing a MEMS microphone in accordance with an example embodiment of the present invention. FIGS. 5 to 15 are cross sectional views illustrating a method of manufacturing a MEMS microphone in accordance with an example embodiment of the present invention.

Figure 5:
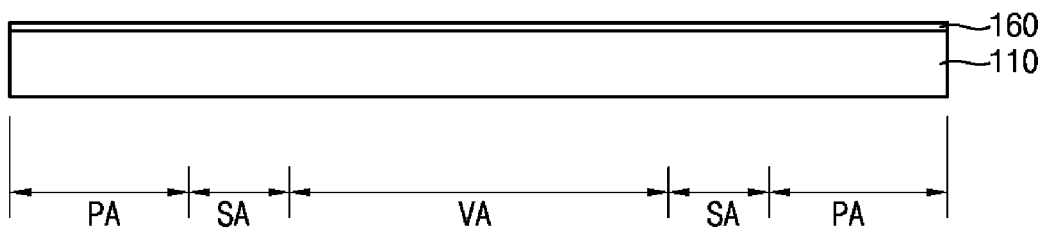
FIGS. 5 to 15 are cross sectional views illustrating a method of manufacturing a MEMS microphone in accordance with an example embodiment of the present invention.

Referring to FIGS. 4 and 5, according to example embodiments of a method for manufacturing a MEMS microphone, a lower insulation layer 160 is formed on a substrate 110 at S110. The substrate 110 is divided into a vibration area VA, a supporting area SA surrounding the vibration area VA, and a peripheral area PA surrounding the supporting area SA.

The lower insulation layer 160 is formed by a deposition process. The lower insulation layer 160 may be made of an oxide such as silicon oxide or TEOS.

Figure 6:
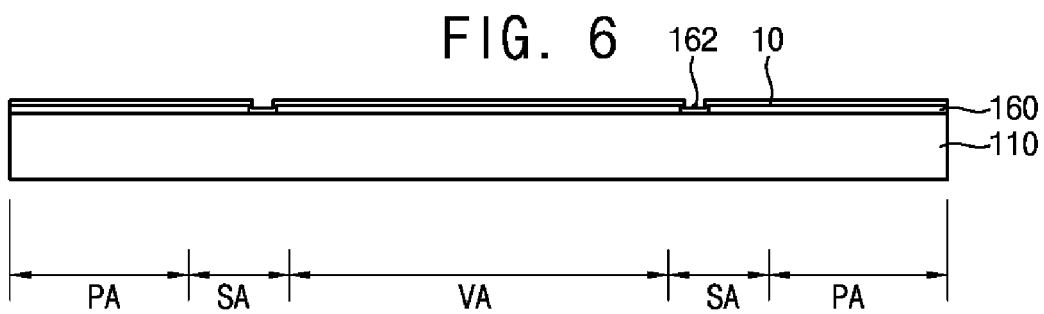
Figure 7:
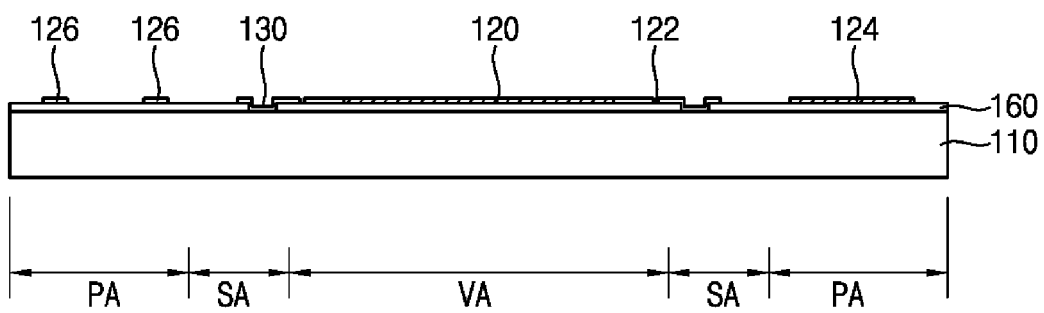

Referring to FIGS. 4, 6 and 7, a diaphragm 120, an anchor 130, a diaphragm pad 124, and a first dummy pad 126 are formed on the lower insulation layer 160 at S130.

The S120 of forming the diaphragm 120, the anchor 130, the diaphragm pad 124, and the first dummy pad will be described in detail as follows.

First, the lower insulation layer 160 is patterned by an etching process to form an anchor channel 162 for forming the anchor 130. Here, a portion of the substrate 110 may be exposed by the anchor channel 162. The anchor channel 162 may be formed in the supporting area SA on the substrate 110. In an example embodiment, the anchor channel 162 may be formed in a ring shape to surround the vibration area VA.

Next, a first silicon layer 10 is formed on the lower insulation layer 160 on which the anchor channel 162 is formed. In an example embodiment, the first silicon layer 10 may be formed of polysilicon.

Subsequently, impurities may be doped into both a portion of the first silicon layer 10 corresponding to the vibration area VA and a portion where the diaphragm pad 124 is to be formed in the first silicon layer 10 through an ion implantation process.

Then, the first silicon layer 10 is patterned through an etching process to form the diaphragm 120, the anchor 130, the diaphragm pad 124, and the first dummy pad 126. The diaphragm pad 124 and the first dummy pad 126 are disposed in the peripheral area PA. The first dummy pad 126 has a ring shape.

A plurality of vent holes 122 may also be formed on the diaphragm 120. The vent holes 122 are disposed in the vibration area VA.

In an example embodiment, the anchor 130 may be arranged in a ring shape along the circumference of the diaphragm 120.

Alternatively, the anchor 130 may be provided in plural, and the plurality of anchors 130 may be spaced apart from each other along the circumference of the diaphragm 120. In particular, slits are formed between two anchors 130 adjacent to each other, and the slits may serve as a passage through which the acoustic wave passes. In addition, the slit may function as a passage for an etchant for removing an intermediate insulation layer 170 disposed between the diaphragm 120 and a back plate 140 in the manufacturing process of the MEMS microphone 100.

Figure 8:
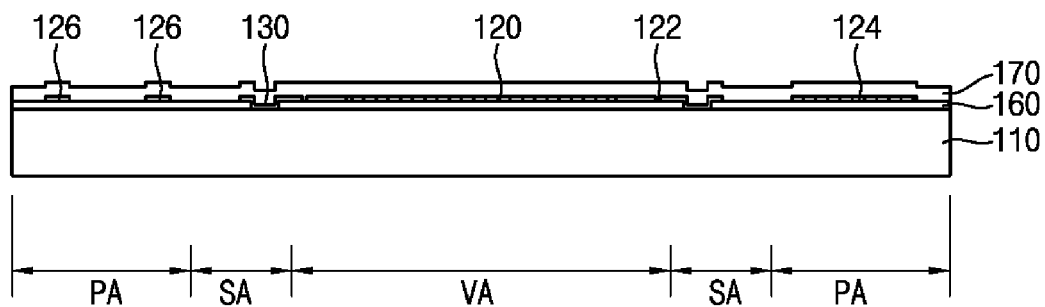

Referring to FIGS. 4 and 8, an intermediate insulation layer 170 is formed on the lower insulation layer 160 on which the diaphragm 120, the anchor 130, the diaphragm pad 124, and the first dummy pad 126 are formed at S130.

The intermediate insulation layer 170 may be formed by a deposition process. The intermediate insulation layer 170 may be made of the same material as that of the lower insulation layer 160. The intermediate insulation layer 170 may be made of an oxide such as silicon oxide or tetraethyl orthosilicate (TEOS).

Figure 9:
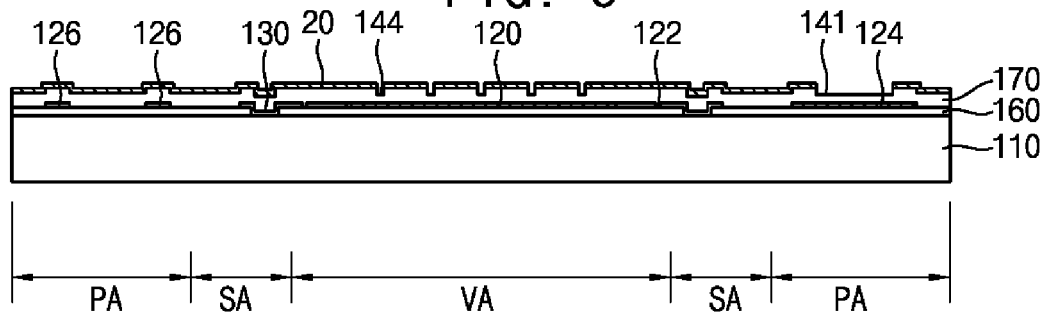
Figure 10:
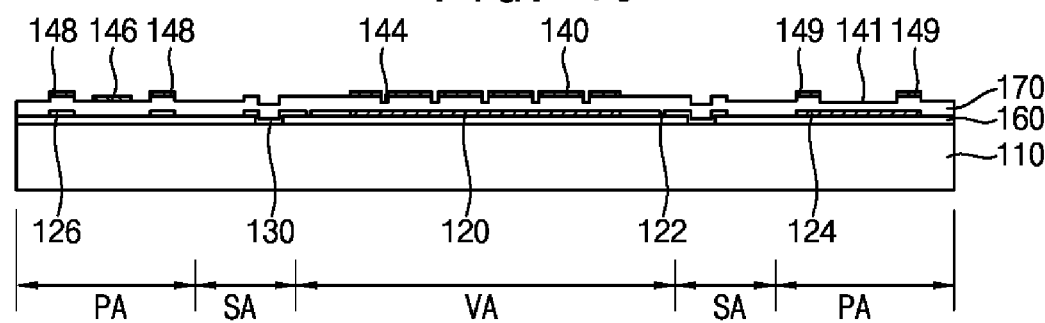

Referring to FIGS. 4, 9 and 10, the back plate 140, a back plate pad 146, a second dummy pad 148, and a third dummy pad 149 are formed on the intermediate insulation layer 170 at S140.

First, after depositing a second silicon layer 20 on an upper surface of the intermediate insulation layer 170, the second silicon layer 20 is doped with impurities through an ion implantation process. In an example embodiment, the second silicon layer 20 may be made of polysilicon.

The second silicon layer 20 is patterned to form dimple holes 144 for forming dimples 154 (see FIG. 2). The dimple holes 144 may be formed in the vibration area VA. Specifically, the dimple holes 144 may be disposed in a portion where the back plate 140 is to be formed. A portion of the intermediate insulation layer 170 corresponding to the dimple hole 144 may be partially etched so that the dimples 154 protrude downward from a lower surface of the back plate 140.

In addition, the second silicon layer 20 is patterned to form a stepped hole 141 in a portion where the first pad electrode 182 (see FIG. 2) is to be formed. The stepped hole 141 may be located above the diaphragm pad 124 in the peripheral area PA.

A portion of the intermediate insulation layer 170 corresponding to the stepped hole 141 may be partially etched so that a thickness of the portion of the intermediate insulation layer 170 where the stepped hole 141 is formed, that is, a portion where the first pad electrode 182 is to be formed is thinner than that of other portion of the intermediate insulation layer 170.

The dimple holes 144 and the stepped holes 141 are formed at the same time, and the intermediate insulation layer 170 may be etched with the same thickness when the dimple holes 144 and the stepped holes 141 are formed.

Next, the second silicon layer 20 is patterned to form the back plate 140, the back plate pad 146, the second dummy pad 148, and the third dummy pad 149. The back plate 140 may be formed in the vibration area VA, and the back plate pad 146, the second dummy pad 148, and the third dummy pad 149 may be formed in the peripheral area PA.

The second dummy pad 148 may be disposed vertically above the first dummy pad 126. Therefore, the second dummy pad 148 may overlap the first dummy pad 126.

The second dummy pad 148 may have a ring shape and may be disposed to surround the back plate pad 146.

The third dummy pad 149 may be disposed vertically above the diaphragm pad 124. Therefore, the third dummy pad 149 may overlap the diaphragm pad 124.

The third dummy pad 149 may have a ring shape. Here, the third dummy pad 149 may be disposed along a circumference of the stepped hole 141.

Figure 11:
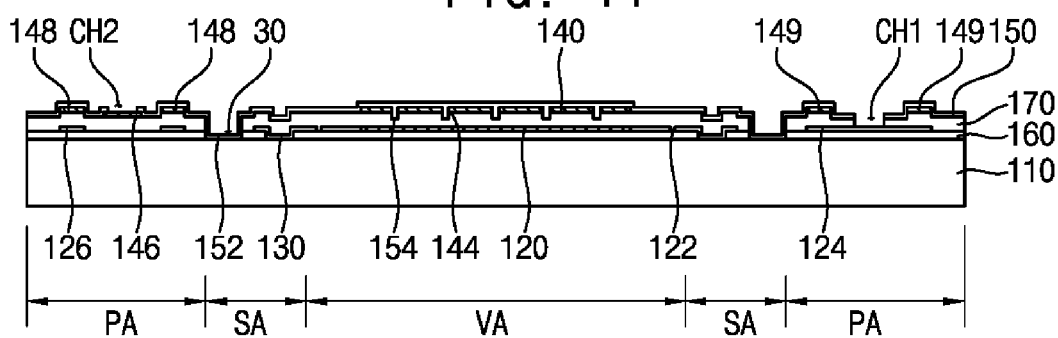

Referring to FIGS. 4 and 11, an upper insulation layer 150 and a strut 152 are formed on the intermediate insulation layer 170 on which the back plate 140, the back plate pad 146, the second dummy pad 148, and the third dummy pad 149 are formed at S150.

In particular, the intermediate insulation layer 170 and the lower insulation layer 160 are patterned to form a strut hole 30 for forming a strut 152 (see FIG. 2) in the supporting area SA. The strut hole 30 may partially expose the substrate 110 in the supporting area SA. Although not shown in detail in figures, the strut channel 30 may have a ring shape to surround the diaphragm 120.

After an insulation layer (not shown in detail in figures) is deposited on the intermediate insulation layer 170 on which the strut hole 30 is formed, the insulation layer is patterned to form an upper insulation layer 150 and the strut 152

The dimples 154 are formed in the dimple holes 144 by depositing the insulation layer.

The insulation layer is patterned to form a second contact hole CH2 formed in the peripheral area PA, and exposing the back plate pad 146.

Then, the first contact hole CH1 is formed by removing the insulation layer and the intermediate insulation layer 170 disposed over the diaphragm pad 124. The diaphragm pad 124 is exposed by the first contact hole CH1.

The upper insulation layer 150 may be made of different materials from those of the lower insulation layer 160 and the intermediate insulation layer 170. In an example embodiment, the upper insulation layer 150 may be made of a nitride such as a silicon nitride material, and the lower insulation layer 160 and the intermediate insulation layer 170 may be made of the oxide.

Figure 12:
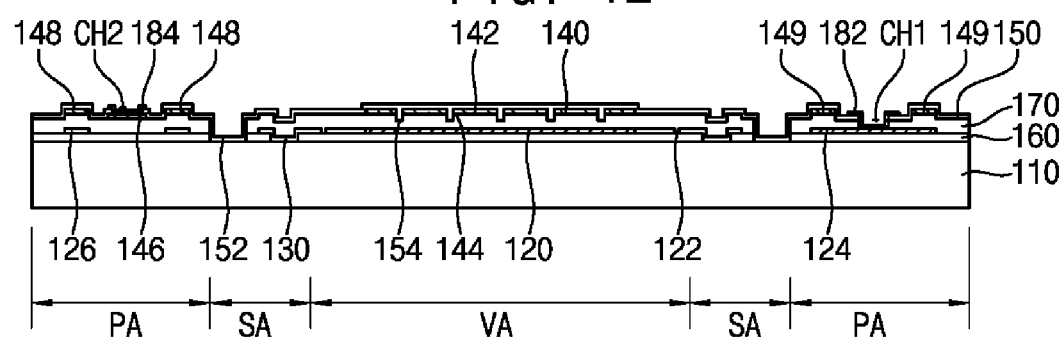

Referring to FIGS. 4 and 12, a first pad electrode 182 and a second pad electrode 184 are respectively formed on the first contact hole CH1 and the second contact holes CH2 in the peripheral area PA at S160.

In particular, a thin layer (not shown in detail in the figures) is deposited on the upper insulation layer 150 on which the first contact hole CH1 and the second contact hole CH2 are formed. In an example embodiment, the thin layer may be made of a conductive metal.

Next, the thin layer is patterned to form the first pad electrode 182 and the second pad electrode 184. Here, the first pad electrode 182 may be formed on the diaphragm pad 124, and the second pad electrode 184 may be formed on the back plate pad 146.

The first pad electrode 182 may be located at a center of the diaphragm pad 124. The third dummy pad 149 may be positioned vertically above the diaphragm pad 124. Therefore, the first pad electrode 182 may be located inside of the third dummy pad 149.

Since the second pad electrode 184 is positioned on the back plate pad 146 and the second dummy pad 148 is disposed to surround the back plate pad 146, the second pad electrode 184 may be located inside of the second dummy pad 148.

The first dummy pad 126 may be arranged to elevate a circumferential portion of the intermediate insulation layer 170 adjacent to the second pad electrode 184 relative to a another portion of the intermediate insulation layer 170 such that a first circumferential portion of the upper insulation layer 150 corresponding to the circumferential portion of the intermediate insulation layer 170, is elevated relative to an upper surface of the second pad electrode 184. The second dummy pad 148 may be arranged to elevate the first circumferential portion of the upper insulation layer 150 corresponding to the first dummy pad 126 relative to another portion of the upper insulation layer 150 such that the first circumferential portion of the upper insulation layer 150 is elevated relative to the upper surface of the second pad electrode 184. The third dummy pad 149 may be arranged to elevate a second circumferential portion of the upper insulation layer 150 adjacent to the first pad electrode 182 relative to another portion of the upper insulation layer 150 such that the second circumferential portion of the upper insulation layer 150 is elevated relative to an upper surface of the first pad electrode 182. Therefore the first pad electrode 182 has the upper surface lower than that of the second circumferential portion of the upper insulation layer 150, and the second pad electrode 184 has the upper surface lower than that of the first circumferential portion of the upper insulation layer 150.

In addition, since the intermediate insulation layer 170 includes a portion located inside of the third dummy pad 149, thinner than that of other portion of the intermediate insulation layer 170, a difference in height between the upper surface of the first pad electrode 182 and the upper surface of the upper insulation layer 150 adjacent to the first pad electrode 182 may be further increased.

Therefore, the first pad electrode 182 and the second pad electrode 184 do not protrude from the upper insulation layer 150.

Figure 13:
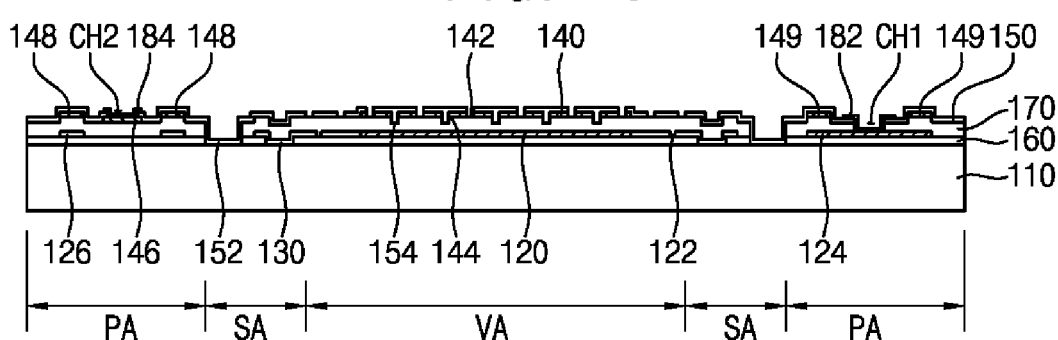

Referring to FIGS. 4 and 13, the upper insulation layer 150 and the back plate 140 are patterned to form acoustic holes 142 in the vibration area VA at S170.

Figure 14:
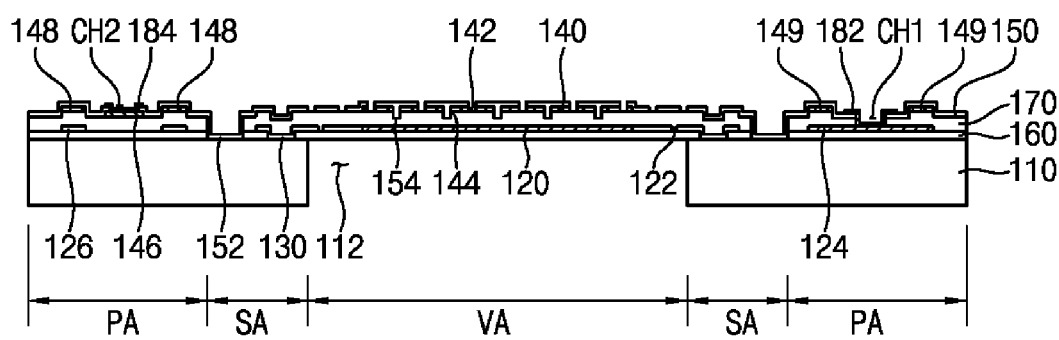

Referring to FIGS. 4 and 14, after forming the acoustic holes 142, the substrate 110 is patterned to form a cavity 112 in the vibration area VA at S180. Thus, a lower surface of the lower insulation layer 160 is partially exposed through the cavity 112.

In order to form the cavity 112, the substrate 110 is patterned while an upper surface of the substrate 110 is fixed to the chuck. Even if the chuck fixes the curved substrate 110, the upper insulation layer 150 only contacts the chuck, and the first pad electrode 182 and the second pad electrode 184 do not contact the chuck. Therefore, it is possible to prevent the first pad electrode 182 and the second pad electrode 184 from being damaged by the chuck.

Figure 15:
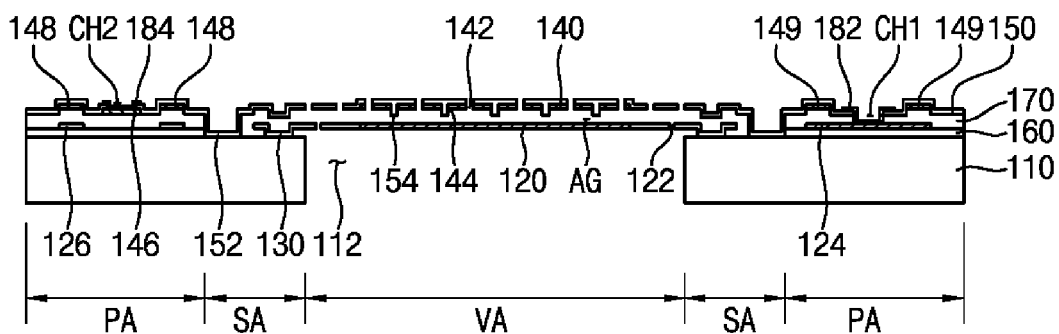

Referring to FIGS. 4 and 15, portions of the intermediate insulation layer 170 and the lower insulation layer 160, corresponding to the vibration area VA and the supporting area SA are removed through an etching process using the cavity 112, the acoustic holes 132, and the vent holes 122 at S190.

Thus, the diaphragm 120 is exposed through the cavity 112, and an air gap AG is formed between the diaphragm 120 and the back plate 140. The cavity 112, the acoustic holes 132, and the vent holes 122 may serve as passages for the etchant to remove the portions of the lower insulation layer 160 and the intermediate insulation layer 170 during the etching process.

Particularly, in S210 of removing the portions of the intermediate insulation layer 170 and the lower insulation layer 160, corresponding to the vibration area VA and the supporting area SA, the anchor 130, and the strut 152 may serve as a barrier for preventing etchant from flowing toward the peripheral area PA. Accordingly, an etching amount of the intermediate insulation layer 170 and the lower insulation layer 160 can be easily controlled.

In an example embodiment of the present invention, a hydrogen fluoride vapor (HF vapor) may be used as the etchant for removing the intermediate insulation layer 170 and the lower insulation layer 160.

As described above, according to the methods of manufacturing a MEMS microphone of the present invention, even if a chuck fixes the curved substrate 110 in the manufacturing process of the MEMS microphone 100, the first pad electrode 182 and the second pad electrode 184 do not contact the chuck. Since the first pad electrode 182 and the second pad electrode 184 can be prevented from being damaged by the chuck, yield of the MEMS microphone manufacturing process can be improved as compared with conventional MEMS microphone manufacturing process.

In addition, while removing the portions of the intermediate insulation layer 170 and the lower insulation layer 160, corresponding to the vibration area VA and the supporting area SA, the strut 152 may serve as a barrier for preventing etchant from flowing toward the peripheral area PA. Accordingly, an etching amount of the intermediate insulation layer 170 and the lower insulation layer 160 can be easily controlled.

Further, the diaphragm 120 may have the vent holes 122 serving as passages for the etchant so that efficiency of the etching process can be improved.

Although the MEM microphone has been described with reference to the specific embodiments, they are not limited thereto. Therefore, it will be readily understood by those skilled in the art that various modifications and changes can be made thereto without departing from the spirit and scope of the appended claims.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

What is claimed is:

1. A MEMS microphone comprising:
   a substrate presenting a vibration area, a supporting area surrounding the vibration area, and a peripheral area surrounding the supporting area, the substrate defining a cavity formed in the vibration area;
   a diaphragm being disposed over the substrate to cover the cavity, the diaphragm being spaced apart from the substrate and configured to generate a displacement thereof in response to an applied acoustic pressure;
   an upper back plate being disposed over the diaphragm in the vibration area, the upper back plate being spaced apart from the diaphragm to form an air gap between the diaphragm and the upper back plate, and the upper back plate defining a plurality of acoustic holes therein;
   a diaphragm pad disposed in the peripheral area and in electrical contact with the diaphragm;
   a back plate pad disposed in the peripheral area and in electrical contact with the back plate;
   an upper insulation layer covering the back plate and mechanically coupled to the back plate to space the back plate apart from the diaphragm;
   a lower insulation layer disposed on an upper surface of the substrate and supporting the diaphragm pad;
   an intermediate insulation layer disposed between the lower insulation layer and the upper insulation layer and supporting the back plate pad;
   a first pad electrode penetrating through the upper insulation layer and the intermediate insulation layer and disposed on the diaphragm pad;
   a second pad electrode penetrating through the upper insulation layer and disposed on the back plate pad;
   a first dummy pad interposed between the lower insulation layer and the intermediate insulation layer, wherein the first dummy pad is arranged to elevate a circumferential portion of the intermediate insulation layer adjacent to the second pad electrode relative to a another portion of the intermediate insulation layer such that a first circumferential portion of the upper insulation layer corresponding to the circumferential portion of the intermediate insulation layer, is elevated relative to an upper surface of the second pad electrode;
   a second dummy pad interposed between the intermediate insulation layer and the upper insulation layer to surround the back plate pad, wherein the second dummy pad is arranged to elevate the first circumferential portion of the upper insulation layer corresponding to the first dummy pad relative to another portion of the upper insulation layer such that the first circumferential portion of the upper insulation layer is elevated relative to the upper surface of the second pad electrode; and
   a third dummy pad interposed between the intermediate insulation layer and the upper insulation layer, wherein the third dummy pad is arranged to elevate a second circumferential portion of the upper insulation layer adjacent to the first pad electrode relative to another portion of the upper insulation layer such that the second circumferential portion of the upper insulation layer is elevated relative to an upper surface of the first pad electrode.

2. The MEMS microphone of claim 1, wherein the second dummy pad is disposed above the first dummy pad.

3. The MEMS microphone of claim 1, wherein the third dummy pad is disposed above the diaphragm pad.

4. The MEMS microphone of claim 1, wherein the intermediate insulation layer includes a portion located inside of the third dummy pad, thinner than that of other portion of the intermediate insulation layer so that the upper surface of the upper insulation layer adjacent to the first pad electrode protrudes from the upper surface of the first pad electrode.

5. The MEMS microphone of claim 1, wherein the diaphragm, the diaphragm pad and the first dummy pad all have a first thickness, and the back plate, the back plate pad, the second dummy pad and the third dummy pad all have a second thickness, and wherein the first thickness can be either the same as or different from the second thickness.

6. The MEMS microphone of claim 1, wherein the lower insulation layer and the intermediate insulation layer are disposed in the peripheral area.

7. A method of manufacturing a MEMS microphone, comprising:
   forming a lower insulation layer on a substrate being divided into a vibration area, a supporting area surrounding the vibration area, and a peripheral area surrounding the supporting area;
   forming a diaphragm on the lower insulation layer in the vibration area, a diaphragm pad in electrical contact with the diaphragm on the lower insulation layer in the peripheral area, and a first dummy pad on the lower insulation layer in the peripheral area;
   forming an intermediate insulation layer on the lower insulation layer to cover the diaphragm, the diaphragm pad, and the first dummy pad;
   forming a back plate facing the diaphragm on the intermediate insulation layer in the vibration area, a back plate pad in electrical contact with the back plate on the intermediate insulation layer in the peripheral area, a second dummy pad on the intermediate insulation layer in the peripheral area, and a third dummy pad on the intermediate insulation layer in the peripheral area;
   forming an upper insulation layer holding the back plate to be spaced from the diaphragm on the intermediate insulation layer to cover the back plate, the back plate pad, the second dummy pad, and the third dummy pad;
   forming a first pad electrode penetrating through the upper insulation layer on the diaphragm pad and the intermediate insulation layer; and
   forming a second pad electrode penetrating through the upper insulation layer on the back plate pad,
   wherein the first dummy pad is arranged to elevate a circumferential portion of the intermediate insulation layer adjacent to the second pad electrode relative to a another portion of the intermediate insulation layer such that a first circumferential portion of the upper insulation layer corresponding to the circumferential portion of the intermediate insulation layer, is elevated relative to an upper surface of the second pad electrode,
   wherein the second dummy pad is arranged to elevate the first circumferential portion of the upper insulation layer corresponding to the first dummy pad relative to another portion of the upper insulation layer such that the first circumferential portion of the upper insulation layer is elevated relative to the upper surface of the second pad electrode, and wherein the third dummy pad is arranged to elevate a second circumferential portion of the upper insulation layer adjacent to the first pad electrode relative to another portion of the upper insulation layer such that the second circumferential portion of the upper insulation layer is elevated relative to an upper surface of the first pad electrode.

8. The method of claim 7, wherein the second dummy pad is disposed above the first dummy pad.

9. The method of claim 7, wherein the third dummy pad is disposed above the diaphragm pad.

10. The method of claim 7, further comprising:

prior to forming the back plate, the back plate pad, the second dummy pad and the third dummy pad, respectively, forming a stepped hole by partially etching the intermediate insulation layer in the portion where the first pad electrode is to be formed.

11. The method of claim 7, wherein the forming of the first pad electrode and the second pad electrode includes:

forming a first contact hole exposing the diaphragm pad by patterning the upper insulation layer and the intermediate insulation layer in the peripheral area;

forming a second contact hole exposing the back plate pad by patterning the upper insulation layer in the peripheral area; and forming the first pad electrode on the diaphragm pad inside of the first contact hole, and the second pad electrode on the back plate pad inside of the second contact hole, respectively.

12. The method of claim 7, further comprising:

after forming the first pad electrode and the second pad electrode, patterning the back plate to form a plurality of acoustic holes which penetrate through the back plate and the upper insulation layer;

patterning the substrate to form a cavity in the vibration area; and performing an etching process using the cavity and the acoustic holes to remove portions of the sacrificial layer and the lower insulation layer, located at positions corresponding to the vibration area and the supporting area so that a displacement of the diaphragm is generated by an applied acoustic pressure.

13. The method of claim 12, wherein forming the diaphragm, the diaphragm pad, and the first dummy pad includes forming a plurality of vent holes penetrating through the diaphragm simultaneously with the diaphragm, the diaphragm pad, and the first dummy pad, and wherein the vent holes are formed in the vibration area.

14. The method of claim 13, wherein the vent holes serve as passages for the etchant to remove the portions of the lower insulation layer and the intermediate insulation layer during the etching process.

* * * * *